United States Patent [19]

Sato

[11] Patent Number: 5,141,972
[45] Date of Patent: Aug. 25, 1992

[54] INSULATING MATERIAL AND PRODUCTION THEREOF

[75] Inventor: Yoshiaki Sato, Saitama, Japan

[73] Assignee: W. L. Gore & Associates, Inc., Newark, Del.

[21] Appl. No.: 692,767

[22] Filed: Apr. 29, 1991

[30] Foreign Application Priority Data

May 1, 1990 [JP] Japan .................................. 2-115596

[51] Int. Cl.$^5$ .............................................. C08V 9/32
[52] U.S. Cl. .................................... 523/218; 521/54; 521/55; 521/145; 523/219
[58] Field of Search .................. 523/218, 219; 521/54, 521/55, 145

[56] References Cited

U.S. PATENT DOCUMENTS

| | | | |
|---|---|---|---|
| 4,885,321 | 12/1989 | Nitoh et al. | 521/54 |
| 4,957,798 | 9/1990 | Bogdany | 521/54 |
| 4,978,690 | 12/1990 | Hill | 521/54 |
| 4,980,102 | 12/1990 | Hill | 521/54 |

*Primary Examiner*—Morton Foelak
*Attorney, Agent, or Firm*—Gary A. Samuels

[57] ABSTRACT

An insulation material made of rigid microballons within the pores of a porous polymeric base material.

1 Claim, 1 Drawing Sheet

INSULATING MATERIAL AND PRODUCTION THEREOF

FIELD OF THE INVENTION

The present invention relates to an insulating material which has improved electrical properties owing to microspheres incorporated therein, and also to a process for producing the same.

BACKGROUND OF THE INVENTION

Among conventional common insulating material fluoroethylene (PTFE) resin and polyethylene resin which have low dielectric constants. They are often used in porous form for their improvement in electrical properties. Unfortunately, a porous PTFE resin structure cannot be produced by conventional physical or chemical processes using inert gas or blowing agents which are commonly applied to other fluoroplastics and ordinary thermoplastic resins, because a PTFE resin has an extremely high melt viscosity. This necessitates the use of special processes, such as mixing a PTFE resin with a substance removable by extraction or dissolution, forming the mixture under pressure, and removing the substance afterward, or such as adding a liquid lubricant to a PTFE resin powder, extruding and forming the mixture by rolling or other shear force, removing the liquid lubricant, and drawing and sintering the molded item, or such as drawing an unsintered molded item of PTFE resin in a liquid (such as halogenated hydrocarbon, petroleum hydrocarbon, alcohol, and ketone) which sets a PTFE resin, and sintering the molded item afterward.

The processes mentioned above all give rise to open-cell porous PTFE structures, which are liable to partly change into that of closed-cell structures because their pores are easily collapsed by compressive force. This tendency is undesirable particularly in the case where the porosity is increased to lower the dielectric constant. If such a porous PTFE resin is molded into tape or sheet as an insulating material for electric wires and printed-circuit boards, the resulting insulating material is hard to handle because of its unstable electrical properties (such as dielectric constant).

In order to eliminate the above-mentioned disadvantages involved in the prior art technologies the present inventors previously proposed a process for producing a porous closed-cell PTFE structure. This process consists of mixing a PTFE resin with glass or silica microspheres containing an inert gas (such as nitrogen and carbon dioxide) sealed therein, and forming the mixture by rolling (or any other means that exerts a shear force) such that the PTFE resin matrix becomes fibers which enclose the microspheres, permitting the gas in the microspheres to substantially remain as voids, as described in Japanese Patent Publication No. 25769/19B9 or in its UK counterpart appln. no. 8B18243.1.

This technology solved many problems associated with the porous open-cell PTFE structures but did not address the fact that the dielectric constant does not decrease in proportion to the amount of microspheres added. To address this problem, the present inventors carried out a series of researches which led to the present invention.

SUMMARY OF THE INVENTION

Accordingly, the present invention provides a new insulating material and a process for producing the same. The insulating material of the present invention is free of disadvantages involved in conventional porous open-cell PTFE structures and maintains its stable electrical properties (including low dielectric constant) under external forces (such as compression).

The present invention is embodied in an insulating material which comprises low-dielectric open-celled porous polymeric base material and a large number of low-dielectric hard microspheres which are held in the pores of said low-dielectric porous polymeric base material for a prevention against pore collapse.

The present invention is also embodied in a process for producing an insulating material which comprises dipping a low-dielectric open-celled porous polymeric base material in an ultrasonically stirred liquid in which, are dispersed a large number of low-dielectric hard microspheres, thereby causing the low-dielectric hard microspheres to enter the pore of the low-dielectric open-celled porous polymeric base material, and subsequently heating the system, thereby causing the low-dielectric porous polymeric base material to shrink slightly so that the low-dielectric hard microspheres are fixed in the pores.

DETAILED DESCRIPTION OF THE INVENTION

Figure 1:
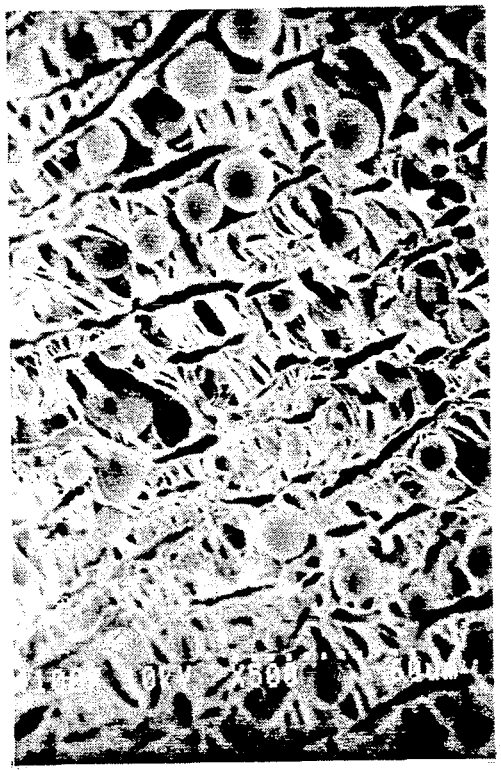
FIG. 1 is an electron micrograph showing the porous structure of the insulating material of the present invention which was taken before heating.

The insulating material of the present invention contains a large number of low-dielectric hard microspheres which are held in the pores of the low-dielectric porous polymeric base material for prevention against pore collapse. These microspheres those of hard insulating material such as glass, particularly glass containing more than 80% silicon dioxide, and have a particle diameter from 0.1 to 50 um, which is selected according to the diameter of pores in the base material. They contain a gas such as nitrogen and carbon dioxide sealed therein, so that they have a low dielectric constant, low loss tangent, and low specific gravity. The amount of the microspheres in the insulating material is not specifically limited; but it is usually in the range of 0.1 to 20 wt%, preferably 1 to 10 wt%.

The low-dielectric, i.e. dielectric constant below 2, porous polymeric base material, which has an open-celled fine porous structure, may be produced from a fluorocarbon resin or polyolefin resin by any known method such as leaching method, emulsion method, irradiation method, sintering method, and stretching or expanding method. According to the stretching and expanding method, the drawing gives rise to fibers and nodes interconnected by fibrils which form fine open cells. The fibrils vary in diameter and length and the nodes vary in size and number depending on the drawing and sintering conditions. The low-dielectric open-celled porous polymeric base material may have a properly selected pore diameter and porosity.

The insulating material of the present invention is constructed such that the polymeric base material holds in its pores low-dielectric rigid microspheres of a size smaller than the pore sizes, e.g. 20 um or less, which effectively prevent the pores from being collapsed by compressive force. Moreover, the insulating material has a low dielectric constant and stable electrical properties because the pores are not completely filled by the microspheres.

The method of the present invention utilizes ultrasonic vibration to disperse the microspheres into the pores of the base material, so that the base material is exempt from compressive force in the manufacturing step. Therefore, the insulating material of the present invention has good electrical properties based on the original low dielectric constant of the base material which is enhanced by the microspheres filled therein.

EXAMPLES

The invention will be described in more detail with reference to the following examples, which are not intended to restrict the scope of the invention.

A sample of the insulating material of the present invention was prepared in the following manner from a low-dielectric porous polymeric base material which is an open-celled porous PTFE resin sheet having a porosity of 75.4%, a thickness of 100 um, and a dielectric constant of 1.20. formed by the known stretching method, and low-dielectric rigid microspheres which are glass microspheres (made by Emerson & Cumming Co., Ltd.) having a dielectric constant of 1.20 and a particle diameter smaller than 15 um. The microspheres were dispersed in acetone held in a metal container placed on an ultrasonic vibrator (50 kHz frequency and 30W output). In the ultrasonically stirred dispersion was dipped the open-celled porous PTFE sheet for 5 minutes. This dipping operation was repeated with the sheet turned up side down. After the dipping operation, the PTFE sheet was dried and then heated at 200°C. for 1 minute without restraint so that the sheet shrank slightly and fixed the microspheres in the pores.

Figure 2:
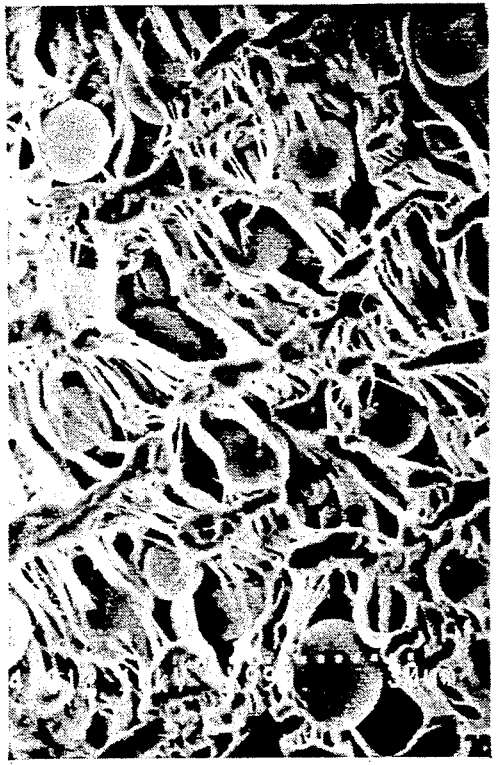
FIG. 2 is an electron micrograph showing the slightly shrunk porous structure of the same insulating material as above taken after heating.

FIGS. 1 and 2 are electron micrographs taken respectively before and after the polymeric base material was treated with microspheres. It is noted that the microspheres are not broken in the pores of the base material but are fixed by the fibrillated PTFE. It is also noted that there is liberal space around the microspheres so that the insulating material retains a high porosity. The sheet had a dielectric constant as low as 1.25 owing to the glass microspheres filled in the pores which accounted for 10 wt%. This sheet was tested for compression resistance by measuring the dielectric constant after compression under a load of 10kg/cm$^2$ for 30 minutes. The results are shown in Table 1.

Figure 3:
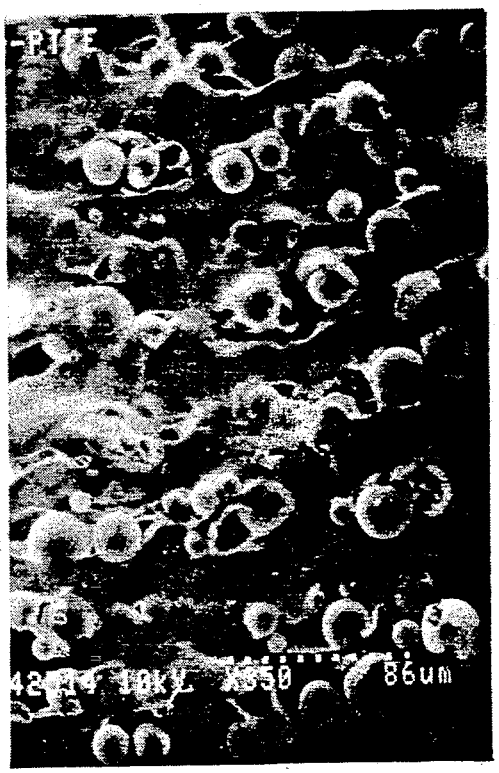
FIG. 3 is an electron micrograph showing the porous structure of the conventional porous insulating material containing microspheres.

In Comparative Example 1, an insulating material in sheet form was prepared by rolling from a PTFE resin powder and glass microspheres mixed in the same ratio as in Example 1 mentioned above. (This insulating material is that which the present inventors proposed in the above-mentioned Japanese Patent Publication No. 25769/1989.) It has the internal structure as shown in FIG. 3. In Comparative Example 2, the same test as in Example 1 was performed on an open-celled porous PTFE sheet which contains no glass microspheres but has almost the same dielectric constant as that of the insulating material in Example 1. The results are shown in Table 1.

TABLE 1

| | Example 1 | | Comparative Example 1 | | Comparative Example 2 | |
|---|---|---|---|---|---|---|
| | Before compression | After compression | Before compression | After compression | Before compression | After compression |
| Dielectric constant | 1.25 | 1.27 | 1.60 | 1.70 | 1.20 | 1.45 |

It is noted from Table 1 that the porous insulating material of the present invention prevents its pores from being collapsed by compressive force and hence keeps its original electrical properties almost unchanged owing to the low-dielectric hard microspheres filled in the pores. In addition, it has a lower dielectric constant than those produced by the conventional method. Therefore, it can be used in the form of film or sheet for insulation of electric wires, cables, and printed-circuit boards. Its low dielectric constant and high stability to external force contribute to the improvement of their performance.

What is claimed is:

1. A process for producing an insulating material which comprises dipping a low dielectric open-celled porous polytetrafluoroethylene (PTFE) in an ultrasonically stirred liquid in which are dispersed a number of low dielectric hard glass or silica microspheres containing an inert gas, thereby causing the low dielectric open-celled porous polytetrafluoroethylene, and subsequently heating the system, thereby causing the low dielectric porous polytetrafluoroethylene shrink slightly so that the low dielectric hard microspheres are fixed in the pores.

* * * * *

UNITED STATES PATENT AND TRADEMARK OFFICE
CERTIFICATE OF CORRECTION

PATENT NO. : 5,141,972
DATED : August 25, 1992
INVENTOR(S) : Yoshiaki Sato

It is certified that error appears in the above-indentified patent and that said Letters Patent is hereby corrected as shown below:

COLUMN 4,

Claim 1, line 7, after "dielectric" insert: --hard microspheres to enter the pores of the low dielectric--.

line 9, after "polytetrafluoroethylene" insert: --to--.

Signed and Sealed this

Twenty-sixth Day of October, 1993

Attest:

BRUCE LEHMAN

Attesting Officer     Commissioner of Patents and Trademarks